(12) United States Patent
Kaneko et al.

(10) Patent No.: US 6,733,952 B2
(45) Date of Patent: May 11, 2004

(54) RESIST COMPOSITION

(75) Inventors: Isamu Kaneko, Kanagawa (JP); Shinji Okada, Kanagawa (JP); Yasuhide Kawaguchi, Kanagawa (JP); Yoko Takebe, Kanagawa (JP); Shun-ichi Kodama, Kanagawa (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 10/316,877

(22) Filed: Dec. 12, 2002

(65) Prior Publication Data

US 2003/0130409 A1 Jul. 10, 2003

Related U.S. Application Data

(63) Continuation of application No. PCT/JP01/05033, filed on Jun. 13, 2001.

(30) Foreign Application Priority Data

Jun. 13, 2000 (JP) ........................................ 2000-176603

(51) Int. Cl.$^7$ .............................................. G03F 7/004
(52) U.S. Cl. ..................... 430/270.1; 430/905; 430/907
(58) Field of Search ............................. 430/270.1, 907, 430/905

(56) References Cited

U.S. PATENT DOCUMENTS

2003/0211417 A1 * 11/2003 Fryd et al. ............... 430/270.1

FOREIGN PATENT DOCUMENTS

| JP | 2001-133979 | 5/2001 |
|----|-------------|--------|
| JP | 2001-154362 | 6/2001 |

* cited by examiner

*Primary Examiner*—Rosemary Ashton
(74) *Attorney, Agent, or Firm*—Oblon, Spivak, McClelland, Maier & Neustadt, P.C.

(57) ABSTRACT

The following resist composition of chemical amplification type, which is excellent in transparency to light beams and dry etching properties and gives a resist pattern excellent in sensitivity, resolution, evenness, heat resistance, etc.

A resist composition which comprises a fluoropolymer (A) comprising monomer units (a) of a fluorovinyl monomer having —$CF_2$—OR (wherein R is a $C_{1-10}$ alkyl group) and monomer units (b) of an alicyclic ethylenic monomer, an acid-generating compound (B) which generates an acid upon irradiation with light, and an organic solvent (C).

8 Claims, No Drawings

RESIST COMPOSITION

This application is a Continuation of application International Application No. PCT/JP01/05033, filed Jun. 13, 2001.

TECHNICAL FIELD

The present invention relates to a novel resist composition containing a fluoropolymer. More particularly, it relates to a resist composition which is useful as a chemical amplification type resist useful for fine processing employing various light beams, such as far ultraviolet rays such as KrF laser or ArF laser, vacuum ultraviolet rays such as $F_2$ laser or X-rays.

BACKGROUND ART

In recent years, along with the progress in fine circuit patterns in the process for producing semiconductor integrated circuits, a photoresist material having high resolution and high sensitivity is desired. As the circuit patterns become fine, a short wavelength of a light source for an exposure apparatus becomes essential. In an application to lithography employing an excimer laser of 250 nm or shorter, a polyvinyl phenol type resin, an alicyclic acrylic type resin or a polynorbornane type resin has, for example, been proposed, but no adequate resolution and sensitivity have been obtained.

It is an object of the present invention to provide a resist composition which is particularly excellent in transparency to light beams and dry etching properties, as a chemical amplification type resist and which gives a resist pattern excellent in sensitivity, resolution, evenness, heat resistance, etc.

DISCLOSURE OF THE INVENTION

The present invention is the following invention which has been made to solve the above-described problems.

A resist composition which comprises a fluoropolymer (A) comprising monomer units (a) of a fluorovinyl monomer having —$CF_2$—OR (wherein R is a $C_{1-10}$ alkyl group) and monomer units (b) of an alicyclic ethylenic monomer, an acid-generating compound (B) which generates an acid upon irradiation with light, and an organic solvent (C).

BEST MODE FOR CARRYING OUT THE INVENTION

Now, the composition of the present invention will be described in detail.

The fluoropolymer (A) comprising, as essential components, monomer units (a) of a fluorovinyl monomer having —$CF_2$—OR and monomer units (b) of an alicyclic ethylenic monomer (hereinafter, monomers forming the respective monomer units will be referred to as (fluoro) monomer (a) and monomer (b), respectively).

The fluoromonomer (a) is a compound having an addition-polymerizable ethylenic double bond and preferably has fluorine atoms other than the fluorine atoms in —$CF_2$—OR. —$CF_2$—OR may be bonded to a carbon atom of the ethylenic double bond, but is preferably bonded to a carbon atom other than the carbon atom of the ethylenic double bond. Further, the ethylenic double bond is preferably an ethylenic double bond having fluorine atoms bonded, as represented by $CF_2$=C.

The fluoromonomer (a) is preferably a compound represented by the following formula (1):

$$CF_2=CF(O)_n(CF_2)_mOR \quad (1)$$

(wherein n is 0 or 1, m is an integer of from 1 to 5, and R is a $C_{1-10}$ alkyl group).

The fluoromonomer (a) represented by the formula (1) is more preferably a compound wherein n is 0 or 1, m is from 1 to 3, and R is a $C_{1-3}$ alkyl group. As the fluoromonomer (a), a fluoroalkene such as $CF_2$=$CFCF_2OCH_3$, $CF_2$=$CFCF_2OC_2H_5$, $CF_2$=$CFCF_2OC_3H_7$, $CF_2$=$CFCF_2CF_2OCH_3$, $CF_2$=$CFCF_2CF_2OC_2H_5$ or $CF_2$=$CFCF_2CF_2OC_3H_7$, and a fluorovinyl ether such as $CF_2$=$CFOCF_2CF_2OCH_3$, $CF_2$=$CFOCF_2CF_2OC_2H_5$ or $CF_2$=$CFOCF_2CF_2OC_3H_7$ may, for example, be specifically mentioned. These monomers may be used alone or in combination as a mixture of two or more of them.

Further, a monomer such as $CF_2$=$CFCF_2OR$ can be synthesized by a reaction of a perfluoroallyl halide with a metal alkoxide (I. L. Knunyants et al, Chem. Abs., 52, 251(1958)).

Further, a monomer such as $CF_2$=$CFO(CF_2)_mOR$ can be synthesized by reacting the corresponding acid fluoride with hexafluoropropylene oxide, followed by pyrolysis (U.S. Pat. No. 4,358,412).

The alicyclic ethylenic monomer (b) is an alicyclic hydrocarbon having an addition-polymerizable ethylenic double bond. Some of the carbon atoms constituting the ring of the alicyclic hydrocarbon may be substituted by a bivalent atom such as an oxygen atom or a bivalent group such as —NH—. The ethylenic double bond may be present in the alicyclic ring or may be present outside of the alicyclic ring, or such double bonds may be present in the ring and outside the ring (usually, any one of the ethylenic double bonds would be involved in the polymerization reaction). Further, the alicyclic ring may be a single ring, a condensed polycyclic ring or any other ring. Further, the monomer (b) may have fluorine atoms or may have fluorine atoms, other hetero atoms or substituents. In a case where the monomer (b) has fluorine atoms, the monomer (b) is a compound which does not have the above-described —$CF_2$—OR.

One of the monomers (b) is a monomer having an ethylenic double bond on at least one carbon atom constituting the alicyclic ring. Namely, it is a monomer having an ethylenic double bond between the adjacent carbon atoms among the carbon atoms constituting the alicyclic ring (a monomer having an ethylenic double bond in the alicyclic ring) or a monomer having an ethylenic double bond between a carbon atom constituting the alicyclic ring and a carbon atom outside of the alicyclic ring. In the monomer having an ethylenic double bond in the alicyclic ring, it may have two or more ethylenic double bonds in the alicyclic ring. The former monomer may, for example, be a cycloalkene or a bicycloalkene, and the latter monomer may, for example, be a monomer represented by the after-mentioned formula (3).

Another one of the monomers (b) is a monomer having an ethylenic double bond outside the alicyclic ring. It may, for example, be a cycloalkane, a bicycloalkane or a tricycloalkane having a vinyl group, a vinyloxy group, an allyl group or the like bonded thereto.

The following compounds may, for example, be mentioned as specific alicyclic ethylenic monomers (b). Vinyl cyclohexane, vinyl adamantane, vinyl norbornanes, vinyl bicyclooctane, cyclohexyl vinyl ether, adamantyl vinyl ethers, norbornyl vinyl ethers, bicyclooctyl vinyl ethers, norbornenes, norbornadienes, a compound represented by the following formula (2), and a compound represented by the following formula (3).

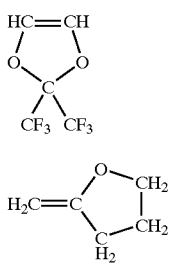

—CF$_2$—OR in the fluoropolymer (A) will be cleaved under an acidic condition and will be converted to the corresponding ester group or an acid fluoride group. The ester group or the acid fluoride group will react with an alkaline aqueous solution (a developer) and will be converted to an alkali salt of a carboxylic acid, whereby the polymer will be water-soluble. Namely, the fluoropolymer (A) exhibits a developability when it is coexistent with the acid-generating compound (B).

The molar ratio of the monomer units (a) to the monomer units (b) in the fluoropolymer (A) is preferably such that monomer units (a)/monomer units (b)=30 to 70/70 to 30. If the proportion of the monomer units (a) is smaller than this, the light transmittance and the developability tend to be low, and if the proportion of the monomer units (b) is smaller than this, the heat resistance and etching durability tend to be low.

The fluoropolymer (A) may contain monomer units of a copolymerizable monomer, preferably a radical polymerizable monomer, other than the monomer units (a) and the monomer units (b), within a range not to impair its properties. The proportion of such other monomer units is preferably at most 15 mol %, based on the total monomer units.

The molecular weight of the fluoropolymer (A) is not particularly limited so long as it can be uniformly dissolved in the after-mentioned organic solvent and can be uniformly coated on a substrate. However, its number average molecular weight as calculated as polystyrene is usually from 1,000 to 100,000, preferably from 2,000 to 20,000. If the number average molecular weight is less than 1,000, troubles are likely to result, such that the resulting resist pattern tends to be defective, the film remaining rate after the development tends to be low or the shape stability during the thermal treatment of the pattern tends to be low. On the other hand, if the number average molecular weight exceeds 100,000, the coating property of the composition is likely to be poor, or the developability is likely to be low.

The fluoropolymer (A) can be obtained by copolymerizing the prescribed proportions of the above-mentioned Monomers in the presence of a polymerization initiating source. Such a polymerization initiating source is not particularly limited so long as it is capable of letting the polymerization reaction proceed radically. It may, for example, be a radical-generating agent, light or ionizing radiation. Particularly preferred is a radical-generating agent, such as a peroxide, an azo compound or a persulfate.

The method for the polymerization is also not particularly limited, and it may, for example, be so-called bulk polymerization in which monomers may be subjected to polymerization as they are, solution polymerization which is carried out in a fluorohydrocarbon, a chlorohydrocarbon, a fluorinated chlorohydrocarbon, an alcohol, a hydrocarbon or any other organic solvent, which is capable of dissolving the monomers, suspension polymerization which is carried out in an aqueous medium in the absence or presence of a suitable organic solvent, or emulsion polymerization which is carried out by adding an emulsifier to an aqueous medium. The temperature or the pressure of the polymerization is not particularly limited. However, the temperature is preferably set within a range of from 0 to 200° C., preferably from room temperature to 100° C. The pressure is preferably within a range of at most 10 MPa, particularly preferably within a range of at most 3 MPa.

As the acid-generating compound (B) which generates an acid upon irradiation with light, it is possible to employ an acid-generating compound which is commonly used for a chemical amplification type resist material. Namely, an onium salt such as a diaryl iodonium salt, a triaryl sulfonium salt, an aryl phenyl diazonium salt or a trialkyl sulfonium salt, or a trichloromethyl-s-triazine may, for example, be mentioned.

The organic solvent (C) is not particularly limited, so long as it is capable of dissolving both components of the fluoropolymer (A) and the acid-generating compound (B). An alcohol such as methyl alcohol or ethyl alcohol, a ketone such as acetone, methyl isobutyl ketone or cyclohexanone, an acetate such as ethyl acetate or butyl acetate, an aromatic hydrocarbon such as toluene or xylene, a glycol monoalkyl ether such as propylene glycol monomethyl ether or propylene glycol monoethyl ether, or a glycol monoalkyl ether ester such as propylene glycol monomethyl ether acetate or carbitol acetate, may, for example, be mentioned.

The proportions of the respective components in the resist composition of the present invention are usually such that per 100 parts by mass of the fluoropolymer (A), the acid-generating compound (B) is from 0.1 to 20 parts by mass, and the organic solvent (C) is from 50 to 2,000 parts by mass. Preferably, per 100 parts by mass of the fluoropolymer (A), the acid-generating compound (B) is from 0.1 to 10 parts by mass, and the organic solvent (C) is from 100 to 1,000 parts by mass.

To the resist composition of the present invention, a surfactant to improve the coating property, a nitrogen-containing basic compound to adjust the acid-generating pattern, and an adhesion-assisting agent to improve the adhesion with the substrate or a storage stabilizer to increase the storage stability of the composition, may, for example, be optionally incorporated. Further, the resist composition of the present invention is preferably employed in such a manner that the respective components are uniformly mixed, followed by filtration by means of a filter of from 0.2 to 2 μm.

The resist composition of the present invention is coated on a substrate such as a silicone wafer, followed by drying to form a resist film. As the coating method, spin coating, cast coating or roll coating may, for example, be employed. The formed resist film will be irradiated with light via a mask having a pattern drawn thereon, followed by development treatment to form a pattern.

The light beams for the irradiation may, for example, be ultraviolet rays such as g-line having a wavelength of 436 nm or 1-line having a wavelength of 365 nm, far ultraviolet rays or vacuum ultraviolet rays, such as KrF laser having a wavelength of 248 mm or F$_2$ laser having a wavelength of 157 nm, or X-rays. The resist composition of the present invention is a resist composition useful particularly for an application where ultraviolet rays having a wavelength of at most 200 nm (hereinafter referred to as short wavelength ultraviolet rays) are used as the light source.

As the development treatment solution, various alkali aqueous solutions are employed. Specifically, sodium hydroxide, potassium hydroxide, ammonium hydroxide, tetramethyl ammonium hydroxide and triethylamine may, for example, be mentioned.

EXAMPLES

Now, the present invention will be described in further detail with reference to Examples, but the present invention is by no means restricted to these Examples. Firstly, prior to Examples, Preparation Examples of polymers used in the present invention will be shown. Here, R113 represents triclhlorotrifluoroethane (organic solvent), and TFE represents polytetrafluoroethylene.

Preparation Example 1

Into a deaerated stainless steel autoclave having an internal capacity of 0.2 l and equipped with a stirrer, 150 g of R113 was charged, and 23.6 g of $CF_2=CFCF_2OC_2H_5$ (hereinafter referred to simply as EFP), 12.6 g of norbornene and 10 ml of a solution containing 10 mass % of diisopropylperoxy dicarbonate in R113, were introduced, whereupon the temperature was raised to 40° C. to initiate the polymerization. After the reaction for 5 hours, the autoclave was cooled to room temperature and then, the polymer solution was taken out. The obtained polymer solution was put into methanol to precipitate the polymer, which was washed and then vacuum-dried at 50° C. to obtain 7.5 g of a fluoropolymer.

The composition of the obtained polymer was such that EFP units/norbornene units=45/55 (mole percent). The molecular weight of the obtained polymer was measured by GPC, whereby the number average molecular weight as calculated as polystyrene was 5,200.

Preparation Example 2

Into a deaerated stainless steel autoclave having an internal capacity of 0.2 l and equipped with a stirrer, 150 g of R113 was charged, and 41.0 g of $CF_2=CFOCF_2CF_2OC_3H_7$ (hereinafter referred to simply as PPBVE), 12.6 g of norbornene and 10 ml of a solution containing 10 mass % of diisopropylperoxy dicarbonate in R113, were introduced, whereupon the temperature was raised to 40° C. to initiate the polymerization. After the reaction for 5 hours, the autoclave was cooled to room temperature, and then, the polymer solution was taken out. The obtained polymer solution was put into methanol to precipitate the polymer, which was washed and then vacuum-dried at 50° C. to obtain 9.8 g of a fluoropolymer.

The composition of the obtained polymer was such that PPEVE units/norbornene units=40/60 (mol %). The molecular weight of the obtained polymer was measured by GPC, whereby the number average molecular weight as calculated as polystyrene was 7,500.

Preparation Example 3

Into a deaerated stainless steel autoclave having an internal capacity of 0.2 l and equipped with a stirrer, 150 g of R113 was charged, and 23.6 g of EFP, 16.9 g of cyclohexyl vinyl ether, and 10 ml of a solution containing 10 mass % of diisopropylperoxy dicarbonate in R113, were introduced, whereupon the temperature was raised to 40° C. to initiate the polymerization. After the reaction for 5 hours, the autoclave was cooled to room temperature, and then, the polymer solution was taken out. The obtained polymer solution was put into methanol to precipitate the polymer, which was washed and then vacuum-dried at 50° C. to obtain 5.5 g of a fluoropolymer.

The composition of the obtained polymer was such that EFP units/cyclohexyl vinyl ether units=48/52 (mol %). The molecular weight of the obtained polymer was measured by GPC, whereby the number average molecular weight as calculated as polystyrene was 9,200.

Preparation Examples 4 and 5

The same treatment as in Preparation Example 1 was carried out except that the charging ratio of the monomers was changed as shown below. The results are shown in Table 1.

TABLE 1

| Preparation Example | EFP | Norbornene | Amount of the formed polymer | Composition (mol%) | Molecular weight |
| --- | --- | --- | --- | --- | --- |
| 4 | 33.0 g | 7.6 g | 5.0 g | 61/39 | 4,800 |
| 5 | 14.2 g | 17.6 g | 4.1 g | 41/59 | 6,200 |

Example 1

100 parts by mass of the fluoropolymer prepared in Preparation Example 1 and 5 parts by mass of trimethyl sulfonium triflate were dissolved in 700 parts by mass of propylene glycol monomethyl ether acetate, followed by filtration by means of a PTFE filter having a pore diameter of 0.1 μm to obtain a resist composition. The above resist composition was spin-coated on a silicon substrate treated with hexamethyldisilazane, followed by heat treatment at 80° C. for 2 minutes to form a resist film having a thickness of 0.3 μm. The absorption spectrum of this film was measured by an ultraviolet visible light photometer, whereby the transmittance at 193 nm was 82%. In an exposure test apparatus flushed with nitrogen, the substrate having the above resist film formed, was placed, and a mask having a pattern drawn by chromium on a quartz plate, was put thereon in close contact therewith. ArF excimer laser beams were irradiated through the mask, whereupon, after exposure at 100° C. for two minutes, baking was carried out. The development was carried out at 23° C. for 3 minutes with a tetramethylammonium hydroxide aqueous solution (0.15 mass %) and then washing was carried out for one minute with pure water. As a result, at an exposure of 20 mJ/cm², only the exposed portion of the resist film was dissolved and removed by the developer, whereby a positive 0.25 μm line and space pattern was obtained.

Examples 2 to 5

These examples were carried out in the same manner as in Example 1 by using the fluoropolymers prepared in Preparation Examples 2 to 5. The results are shown in Table 2.

TABLE 2

| | Transmittance (%) (wavelength: 193 nm) | Sensitivity (mJ/cm²) | Resolution | Developability |
| --- | --- | --- | --- | --- |
| Ex. 2 | 88 | 20 | 0.25 | Good |
| Ex. 3 | 85 | 22 | 0.22 | Good |
| Ex. 4 | 91 | 18 | 0.25 | Good |
| Ex. 5 | 78 | 22 | 0.19 | Good |

Example 6

Etching resistance of the resist films of Examples 1 5 to 5 was measured. The results are shown in Table 3.

TABLE 3

| | Etching resistance |
|---|---|
| Ex. 1 | ○ |
| Ex. 2 | ◉ |
| Ex. 3 | ○ |
| Ex. 4 | ○ |
| Ex. 5 | ◉ |

Etching resistance: the etching rate was measured by an argon/octafluorocyclobutane/oxygen mixed gas plasma, whereby when a novolac resin is rated to be 1, one with a rate of 1.0 or less is represented by ◉, one with a rate of more than 1 and less than 1.2 is represented by ○, and one with a rate of more than 1.2 is represented by X.

INDUSTRIAL APPLICABILITY

The resist composition of the present invention is excellent in dry etching properties and in transparency particularly to short wavelength ultraviolet rays, as a chemical amplification type resist and is capable of readily forming a resist pattern excellent in sensitivity, resolution, evenness, heat resistance, etc.

The entire disclosure of Japanese Patent Application No. 2000-176603 filed on Jun. 13, 2000 including specification, claims and summary is incorporated herein by reference in its entirety.

What is claimed is:

1. A resist composition which comprises a fluoropolymer (A) comprising monomer units (a) of a fluorovinyl monomer having —$CF_2$—OR (wherein R is a $C_{1-10}$ alkyl group) and monomer units (b) of an alicyclic ethylenic monomer, an acid-generating compound (B) which generates an acid upon irradiation with light, and an organic solvent (C).

2. The resist composition according to claim 1, wherein the fluorovinyl monomer having —$CF_2$—OR is a compound represented by the following formula (1):

$$CF_2=CF(O)_n(CF_2)_mOR \qquad (1)$$

(wherein n is 0 or 1, m is an integer of from 1 to 5, and R is a $C_{1-10}$ alkyl group).

3. The resist composition according to claim 2, wherein in the formula (1), n is 0 or 1, m is an integer of from 1 to 3, and R is a $C_{1-3}$ alkyl group.

4. The resist composition according to claim 1, wherein the alicyclic ethylenic monomer is an alicyclic ethylenic monomer having an ethylenic double bond on at least one carbon atom constituting the alicyclic ring.

5. The resist composition according to claim 1, wherein the alicyclic ethylenic monomer is an alicyclic ethylenic monomer having an ethylenic double bond outside of the alicyclic ring.

6. The resist composition according to claim 1, wherein the molar ratio of the monomer units (a) to the monomer units (b) in the fluoropolymer (A) is (a)/(b)=30 to 70/70 to 30.

7. The resist composition according to claim 1, wherein the acid-generating compound (B) is an onium salt.

8. The resist composition according to claim 1, which comprises 100 parts by mass of the fluoropolymer (A), from 0.1 to 20 parts by mass of the acid-generating compound (B) and from 100 to 1000 parts by mass of the organic solvent (C).

* * * * *